(12) United States Patent  (10) Patent No.: US 7,478,411 B2
Song et al.                  (45) Date of Patent: Jan. 13, 2009

(54) OPTICAL PICKUP ACTUATOR AND METHOD WITH MULTI-CONDUCTIVE SUSPENSION

(75) Inventors: Byung-youn Song, Suwon-si (KR); Hyung-loo Kang, Seoul (KR); Sang-yol Yoon, Seoul (KR); Pyong-yong Seong, Seoul (KR); Young-won Lee, Suwon-si (KR)

(73) Assignee: Toshiba Samsung Storage Technology Korea Corporation, Suwon (KR)

( * ) Notice: Subject to any disclaimer, the term of this patent is extended or adjusted under 35 U.S.C. 154(b) by 89 days.

(21) Appl. No.: 11/226,203

(22) Filed: Sep. 15, 2005

(65) Prior Publication Data

US 2006/0061887 A1    Mar. 23, 2006

(30) Foreign Application Priority Data

Sep. 17, 2004   (KR)   .................. 10-2004-0074558

(51) Int. Cl.
G11B 7/09   (2006.01)
G11B 7/085  (2006.01)
G02B 7/02   (2006.01)
(52) U.S. Cl. .................. 720/683; 720/682; 359/813
(58) Field of Classification Search ............... 359/813; 720/682, 683, 684, 685, 686, 687
See application file for complete search history.

(56) References Cited

U.S. PATENT DOCUMENTS

| | | | | |
|---|---|---|---|---|
| 5,073,883 A | * | 12/1991 | Mitsumori | 369/44.15 |
| 5,161,067 A | * | 11/1992 | Tomiyama et al. | 359/824 |
| 5,428,589 A | * | 6/1995 | Shtipelman | 369/44.15 |
| 5,541,899 A | * | 7/1996 | Kume et al. | 369/44.14 |
| 5,684,645 A | * | 11/1997 | Tomiyama et al. | 359/824 |
| 6,377,407 B1 | * | 4/2002 | Susuki et al. | 359/814 |
| 6,798,064 B1 | | 9/2004 | Henry et al. | |
| 2002/0051345 A1 | * | 5/2002 | Serizawa et al. | 361/749 |
| 2003/0161227 A1 | * | 8/2003 | Chong et al. | 369/44.15 |
| 2004/0008982 A1 | * | 1/2004 | Matsuo et al. | 396/89 |
| 2004/0052170 A1 | * | 3/2004 | Ikeda et al. | 369/44.21 |

FOREIGN PATENT DOCUMENTS

| | | |
|---|---|---|
| JP | 59-14142 | 1/1984 |
| JP | 63-311634 | 12/1988 |
| KR | 100137244 B1 | 5/1998 |
| KR | 2001-50546 | 6/2001 |
| KR | 2003-0020930 | 3/2003 |
| KR | 1020030086221 A | 7/2003 |

OTHER PUBLICATIONS

Korean Office Action Issued Apr. 5, 2006 Regarding Korean Application No. 10-2004-0074558.

* cited by examiner

*Primary Examiner*—Jessica T Stultz
(74) *Attorney, Agent, or Firm*—Staas & Halsey LLP

(57) ABSTRACT

An optical pickup actuator including a multi-conductive suspension. The optical pickup actuator may include a base, a holder fixed to the base, a bobbin holding an object lens and having a plurality of driving coils, and a plurality of suspensions connected between the bobbin and the holder and movably supporting the bobbin toward the holder, wherein each of the suspensions may be a multi-conductive suspension including a flexible substrate and a plurality of wires, formed on the flexible substrate, applying currents to the coils.

18 Claims, 3 Drawing Sheets

OPTICAL PICKUP ACTUATOR AND METHOD WITH MULTI-CONDUCTIVE SUSPENSION

CROSS-REFERENCE TO RELATED APPLICATIONS

This application claims the benefit of Korean Patent Application No. 10-2004-0074558, filed on Sep. 17, 2004, in the Korean Intellectual Property Office, the disclosure of which is incorporated herein in its entirety by reference.

BACKGROUND OF THE INVENTION

1. Field of the Invention

Embodiments of the present invention relate to an optical pickup and corresponding actuator having a multi-conductive suspension, and more particularly, to a multi-conductive suspension for an optical pickup having a plurality of stiff conductive metals lined up on a flexible substrate, and an optical pickup actuator having the same.

2. Description of the Related Art

In general, optical pickups can be employed in optical recording/reproducing apparatuses and may enable recording and/or reproducing of information to/from a disk mounted on a turntable while moving in a radial direction of the disk. Such an optical pickup can include an objective focusing a beam emitted from a light source to form an optical spot on an optical disk, and an actuator controlling the objective in a track direction, a focus direction, and a tilt direction to direct the optical spot to a precise location on the optical disk.

FIG. 1 illustrates a perspective view of an actuator. Referring to FIG. 1, a conventional optical pickup actuator includes a base 100, a holder 103 fixed to the base 100, a bobbin 107 for holding an objective 105, a plurality of suspension wires 130 connected between the bobbin 107 and the holder 103 for supporting the bobbin 107, and a magnetic driving unit driving the bobbin 107 in a track direction, a focus direction, and/or a tilt direction. In this case, the suspension wires 130 support the bobbin 107 and draw the bobbin 107 against the holder 103. In addition, the magnetic driving unit can be formed of magnets 110 arranged on the base 100 and a plurality of coils 120, 122, and 125 arranged on the bobbin 107. The bobbin 107 can be driven by an electromagnetic force generated by applying currents to the coils 120, 122, and 125, within a magnetic field generated by the magnets 110. The suspension wires 130 may also transmit the currents to the coils 120, 122, and 125, in addition to supporting the bobbin 107.

However, as the recording capacity of recording media have increased, the resolution required by an optical pickup has accordingly increased, such that the degree of freedom of a corresponding actuator should be increased. In general, when one degree of freedom is increased, the number of coils arranged on the bobbin 107 is increased by one, resulting in an increase of the number of wires applying currents to the coils, by two. For example, in the case of an optical pickup actuator for a blu-ray disk (BD), which has a high recording density, seven wires may be used, including two focusing wires, two tracking wires, and three liquid crystal panel wires for spherical aberration compensation. As the number of wires is increased, the number of the suspension wires 130, operating as the wires, should also be increased. In the case of the optical pickup actuator for the BD, eight suspension wires may be used, as the suspension wires 130 connected to both sides of the bobbin 107 can be kept in symmetry.

In this case, the eight wires can be formed to operate as suspensions having a supporting stiffness. In another case, a portion of the eight wires can be operated as suspensions having a supporting stiffness while another portion of the eight wires can be operated as current providing wires for the coils.

When all eight wires operate as suspensions having supporting stiffness, four wires can be soldered on both sides of the bobbin 107. Accordingly, as the number of soldered portions increases, the assembly of an actuator correspondingly deteriorates and the DC offset tilt and the natural tilt of the actuator become degraded. Furthermore, when the number of wires is increased, the number of the suspension wires should be similarly increased; however, it may become impossible to add a number of suspension wires while still maintaining the present bobbin size. For example, when an additional function, such as the control of radial tilt, is added, the required number of wires becomes nine, and the required number of suspension wires becomes ten, if the aforementioned symmetry is maintained. Thus, five suspension wires can be soldered on both sides of the bobbin. Further, since a predetermined distance should be maintained between the wires to prevent shorts between adjacent wires, it becomes impossible to add the necessary number of suspension wires without increasing the size of the bobbin. However, an increase of the bobbin size results in the increase of the size of the actuator.

On the other hand, when some of the wires operate as suspension wires having supporting stiffness while other wires operate as wires for providing current to the coils, the wires can be easily formed. However, when the suspension wires and the coil wires are separated, assembly processes are increased and shorts may occur between the coil wires or between the suspension wires and the coil wires, resulting in degradation of reliability and increased assembly measures. In addition, the coil wires may not be firmly attached to the bobbin, which may further degrade the overall reliability.

SUMMARY OF THE INVENTION

Embodiments of the present invention provide a multi-conductive suspension formed by arranging a plurality number of stiff wires on a flexible substrate.

Embodiments of the present invention also provide an optical pickup actuator having an increased number of wires, without requiring additional suspension wires, by arranging a plurality number of wires on a suspension.

Embodiments of the present invention further provide a small-sized optical pickup actuator minimizing the number of suspensions regardless of increases in the numbers of corresponding wires.

To achieve the above and/or other aspects and advantages, embodiments of the present invention include a suspension for an optical pickup actuator to movably support a bobbin including a plurality of driving coils and an objective, the suspension including a flexible substrate, and a plurality of wires formed on the flexible substrate to apply current to the coils.

The plurality of wires may be formed of a metal having both stiffness and electric conductivity. Further, the plurality of wires may be pattern etched from deposited metal, deposited on the substrate, with the substrate being a flexible printed circuit board. The metal may also be at least one of copper, steel use stainless, and titanium.

Soldering pads may be formed at ends of the plurality of wires to permit soldering of the plurality of wires, respectively, to the bobbin.

To achieve the above and/or other aspects and advantages, embodiments of the present invention include an optical pickup actuator, including a base, a holder fixed to the base, a bobbin to hold an objective and having a plurality of driving coils, and a plurality of suspensions to connect the bobbin and the holder and to movably support the bobbin relative to the holder, wherein each of the suspensions is a multi-conductive suspension including a flexible substrate and a plurality of wires formed on the flexible substrate to apply current to the coils.

An end of the multi-conductive suspension may be affixed to a side of the bobbin, with the plurality of wires being bent toward the bobbin at affixing areas of the multi-conductive suspension and the bobbin. Further, four multi-conductive suspensions may be affixed to the bobbin, with two respective multi-conductive suspensions being affixed to two respective sides of the bobbin, and wherein an overall number of the wires electrically connected to the bobbin is manageable by respectively managing a number of wires formed on each multi-conductive suspension.

To achieve the above and/or other aspects and advantages, embodiments of the present invention include an optical pickup actuator method, including affixing a holder to a base, supporting a bobbin on the base and relative to the holder, with the bobbin holding an objective and having a plurality of driving coils, and the supporting of the bobbin and/or a driving of the coils is performable by a plurality of suspensions affixed to the bobbin and the holder, separate from the bobbin, movably providing the supporting of the bobbin relative to the holder, and wherein each of the suspensions is a multi-conductive suspension including a flexible substrate and a plurality of wires formed on the flexible substrate to provide current for the driving of the coils.

The supporting and/or driving may include affixing the suspensions at soldering pads formed at ends of the plurality of wires permitting soldering of the plurality of wires, respectively, to the bobbin. In addition, the supporting and/or driving may also include affixing an end of the multi-conductive suspension a side of the bobbin, with the plurality of wires being bent toward the bobbin at affixing areas of the multi-conductive suspension and the bobbin. Further, the four multi-conductive suspensions may be affixed to the bobbin, with two respective multi-conductive suspensions being affixed to two respective sides of the bobbin, and wherein an overall number of the wires electrically connected to the bobbin is manageable by respectively managing a number of wires formed on each multi-conductive suspension.

The method may further include depositing a metal on the substrate, a flexible printed circuit board, and pattern etching the metal to generate the plurality of wires. The metal may also be at least one of copper, steel use stainless, and titanium.

Additional aspects and/or advantages of the invention will be set forth in part in the description which follows and, in part, will be apparent from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
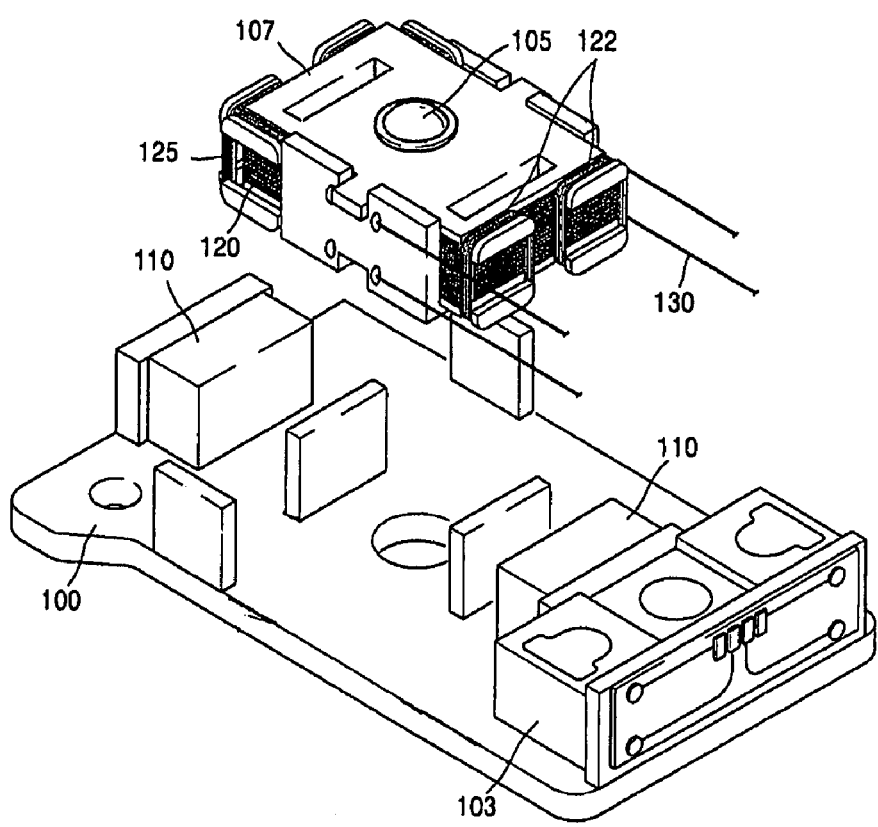
FIG. 1 illustrates a conventional optical pickup actuator.

Reference will now be made in detail to embodiments of the present invention, examples of which are illustrated in the accompanying drawings, wherein like reference numerals refer to the like elements throughout. The embodiments are described below to explain the present invention by referring to the figures.

Figure 2:
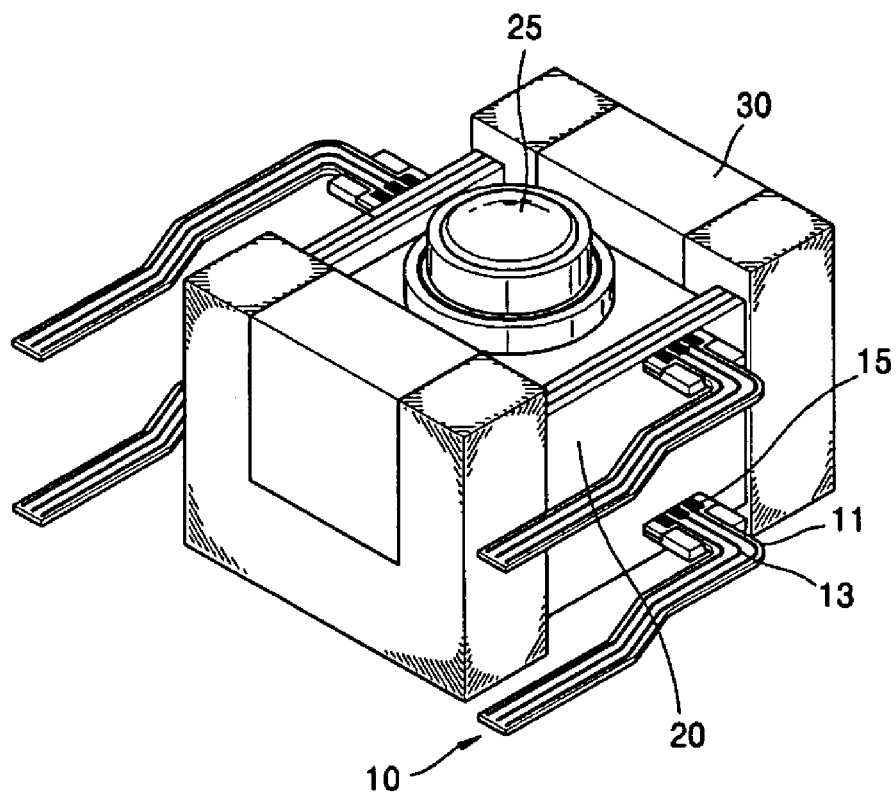
FIG. 2 illustrates an optical pickup actuator having a multi-conductive suspension, according to an embodiment of the present invention.

FIG. 2 illustrates an optical pickup actuator having a multi-conductive suspension, according to an embodiment of the present invention. Here, a base and a holder may be the same as the aforementioned conventional base and holder, thus they are not shown in FIG. 2. In addition, a plurality of coils wound around a bobbin 20 are similarly not shown in FIG. 2, for convenience of illustration. Referring to FIG. 2, the optical pickup actuator, according to an embodiment of the present invention, uses a multi-conductive suspension 10 formed by arranging a plurality of wires 13 on a flexible substrate 11, instead of suspension wires operating as current providing wires, as detailed above regarding the conventional optical pickup actuator. In other words, according to an embodiment of the present invention, a suspension for movably supporting a bobbin 20, which supports an objective 25, can be a substrate including a plurality of wires applying currents to coils.

Figure 3:
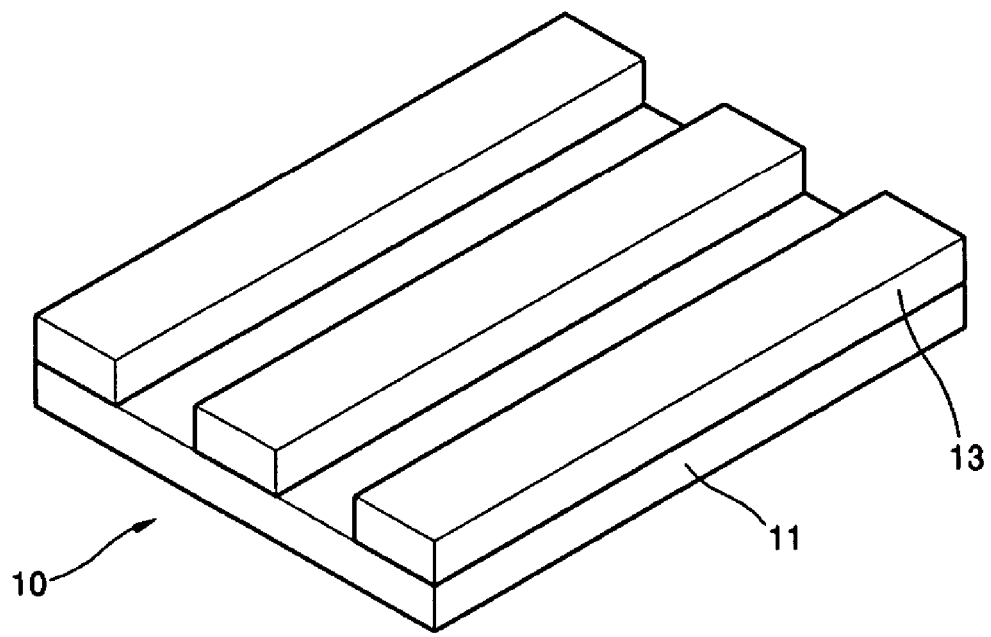
FIG. 3 illustrates a multi-conductive suspension, according to an embodiment of the present invention.

FIG. 3 illustrates the multi-conductive suspension 10, according to an embodiment of the present invention. Referring to FIG. 3, the multi-conductive suspension 10 may include a flexible substrate 11 and a plurality of wires 13 formed on the flexible substrate 11. For example, three wires 13 can be formed on the flexible substrate 11 in FIG. 3, noting that differing wire numbers are equally available, e.g., there could be two or there could be more than four wires. The flexible substrate 11 helps the wires 13 stably affix to a bobbin 20 while fixing the plurality of wires 13 to maintain a predetermined interval between one another. The wires 13 can be formed of a metal having sufficient stiffness to operate as a suspension and enabling for electric conductivity to transmit currents to coils. Examples of the wires 13 may include copper (Cu), steel use stainless (SUS), and titanium (Ti), for example, noting that additional embodiments are equally available.

The multi-conductive suspension 10 could be easily manufactured by using the same method of manufacturing a printed circuit board (PCB). For example, the above-described metal can be deposited on a plastic substrate having sufficient softness, such as polyimide, and the metal may be partially etched to pattern the metal into the shape shown in FIG. 3. Since the wires 13 may be firmly fixed on the flexible substrate 11, the intervals between the wires 13 may be uniformly maintained. Therefore, shorts between adjacent wires 13 should not occur. In addition, since the substrate 11 may be formed of a flexible substrate and the wires 13 may be formed of a stiff material having predetermined elasticity, the multi-conductive suspension 10, according to an embodiment of the present invention, can support the bobbin 20 while moving the bobbin 20 in a track direction, a focus direction, and/or a tilt direction, for example.

Figure 4A:
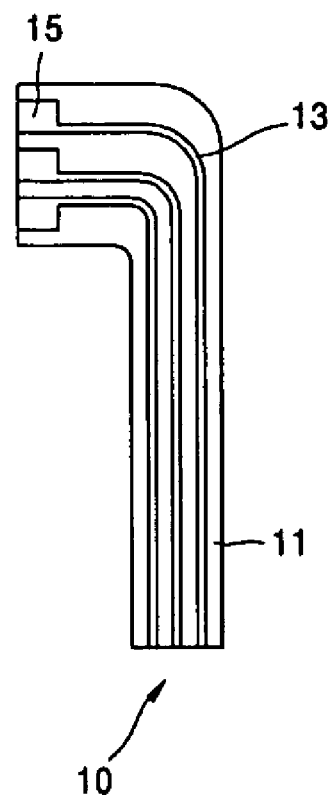
FIGS. 4A and 4B illustrate multi-conductive suspensions, according to further embodiments of the present invention.
Figure 4B:
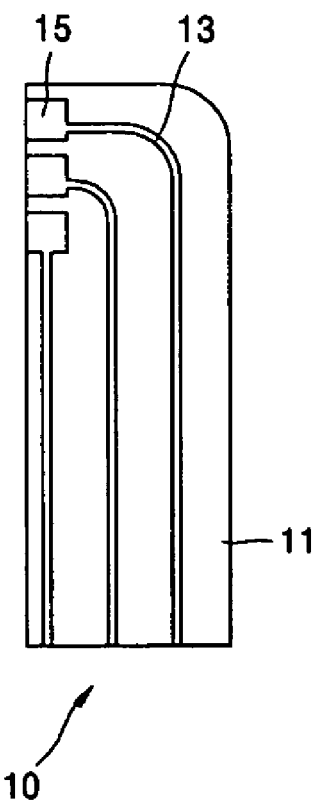

FIGS. 4A and 4B illustrate multi-conductive suspensions, according to embodiments of the present invention. Referring to FIG. 2, magnets 30 applying magnetic fields to coils can be installed along the front and rear of the bobbin 20, for example. Thus, suspensions supporting the bobbin 20 can be affixed to the bobbin 20 along both sides of the bobbin 20. In the case of conventional suspensions formed of wires, the ends of the wires are typically soldered to the sides of the bobbin. However, according to embodiments of the present invention, the multi-conductive suspension 10 can be formed by arranging a plurality of wires 13 on the substrate 11. Therefore, the wires 13 may be bent toward the bobbin 20 in order to simply affix the wires 13 to the side of the bobbin 20, as shown in FIG. 4A. Referring to FIGS. 2 and 4A, the ends of the substrate 11 and the wires 13 can be orthogonally bent toward the bobbin 20. Alternatively, only the ends of the wires 13 may be bent toward the bobbin 20, as shown in FIG. 4B.

The multi-conductive suspension 10, according to embodiments of the present invention, can be affixed to the bobbin 20 by soldering the wires 13 to the sides of the bobbin 20. Accordingly, soldering pads 15 may be formed at the ends of the wires 13 to easily enable the soldering of the wires 13 to the bobbin 20, as shown in FIGS. 4A and 4B. The soldering pads 15 may also be integrally formed with the wires 13 by using the same material as the wires 13. Further, the soldering pads 15 may be formed while patterning the wires 13 on the substrate 11 by etching, for example.

In one embodiment, four suspensions may be used to support the bobbin 20, with two suspensions on the both sides of the bobbin 20, as shown in FIG. 2. When the number of the suspensions is increased, the manufacturing efficiency may deteriorate and the dispersion may be increased when mass-producing actuators. On the other hand, when only two suspensions are used, the actuator may become kinetically unstable. Accordingly, four multi-conductive suspensions 10 may support the bobbin 20, according to an embodiment of the present invention. In this case, when three wires 13 are formed on each suspension 10, twelve wires 13 can be connected to the bobbin 20. As described above, nine wires may be required for spherical aberration compensation, a radial tilt, focusing, and tracking, and thus, a sufficient number of wires 13 can be provided in the actuator, according to the embodiment of the present invention. In addition, even when a tangential tilt is added, e.g., 11 wires may be required, a sufficient number of wires 13 can also be provided. When additional functions are added to precisely control the actuator, the number of wires formed on the suspensions can be increased while also fixing the number of the suspensions to four, for example. In other words, the number of wires can be sufficiently increased by merely controlling the number of wires on the suspension while maintaining the actual number of the suspensions.

As described above, a number of the suspensions may not need to be increased, even when the required number of wires is increased, by arranging a plurality of wires on a suspension. Further, the number of wires can be increased while not increasing the size of an actuator, and the size of the actuator can be reduced by minimizing the number of suspensions, regardless of the increase in the number of the wires. Furthermore, the assembly of the actuator may not be deteriorated, even when the number of the wires is increased. In addition, since the wires are fixed on the substrates, electric shorts between adjacent wires is also prevented.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A suspension for an optical pickup actuator to movably support a bobbin comprising a plurality of driving coils and an objective, the suspension comprising:
   a flexible substrate; and
   a plurality of suspension wires formed on a surface of the flexible substrate, the plurality of suspension wires applying current to the coils and at least vertically and movably supporting the bobbin,
   wherein the plurality of suspension wires are disposed along the surface of the flexible substrate.

2. The suspension of claim 1, wherein the plurality of wires are formed of a metal having both stiffness and electric conductivity.

3. The suspension of claim 2, wherein the plurality of wires are pattern etched from deposited metal, deposited on the substrate, with the substrate being a flexible printed circuit board.

4. The suspension of claim 2, wherein the metal is at least one of copper, steel use stainless, and titanium.

5. The suspension of claim 1, wherein soldering pads are formed at ends of the plurality of wires to permit soldering of the plurality of wires, respectively, to the bobbin.

6. An optical pickup actuator, comprising:
   a base;
   a holder fixed to the base;
   a bobbin to hold an objective and having a plurality of driving coils; and
   a plurality of suspensions to connect the bobbin and the holder and to at least vertically and movably support the bobbin relative to the holder, wherein
   each of the suspensions is a multi-conductive suspension comprising
   a flexible substrate, and
   a plurality of suspension wires formed on a surface of the flexible substrate, the plurality of suspension wires applying current to the coils and at least vertically and movably supporting the bobbin,
   wherein the plurality of suspension wires are disposed along the surface of the flexible substrate.

7. The optical pickup actuator of claim 6, wherein the plurality of wires are formed of a metal having both stiffness and electric conductivity.

8. The optical pickup actuator of claim 7, wherein the plurality of wires are pattern etched from deposited metal, deposited on the substrate, with the substrate being a flexible printed circuit board.

9. The optical pickup actuator of claim 7, wherein the metal is at least one of copper, steel use stainless, and titanium.

10. The optical pickup actuator of claim 6, wherein soldering pads are formed at ends of the plurality of wires to permit soldering the plurality of wires, respectively, to the bobbin.

11. The optical pickup actuator of claim 6, wherein an end of the multi-conductive suspension is affixed to a side of the bobbin, with the plurality of wires being bent toward the bobbin at affixing areas of the multi-conductive suspension and the bobbin.

12. The optical pickup actuator of claim 11, wherein four multi-conductive suspensions are affixed to the bobbin, with two respective multi-conductive suspensions being affixed to two respective sides of the bobbin, and wherein an overall number of the wires electrically connected to the bobbin is manageable by respectively managing a number of wires formed on each multi-conductive suspension.

13. An optical pickup actuator method, comprising:
affixing a holder to a base;
at least vertically supporting a bobbin on the base and relative to the holder, with the bobbin holding an objective and having a plurality of driving coils; and
the supporting of the bobbin and/or a driving of the coils is performable by a plurality of suspensions affixed to the bobbin and the holder, separate from the bobbin, movably providing the supporting of the bobbin relative to the holder, and wherein
each of the suspensions is a multi-conductive suspension comprising a flexible substrate and a plurality of suspension wires formed on a surface of the flexible substrate, the plurality of suspension wires providing current for the driving of the coils and at least vertically and movably supporting the bobbin,
wherein the plurality of suspension wires are disposed along the surface of the flexible substrate.

14. The method of claim 13, wherein the supporting and/or driving comprises affixing the suspensions at soldering pads formed at ends of the plurality of wires permitting soldering of the plurality of wires, respectively, to the bobbin.

15. The method of claim 13, wherein the supporting and/or driving comprises affixing an end of the multi-conductive suspension a side of the bobbin, with the plurality of wires being bent toward the bobbin at affixing areas of the multi-conductive suspension and the bobbin.

16. The method of claim 15, wherein four multi-conductive suspensions are affixed to the bobbin, with two respective multi-conductive suspensions being affixed to two respective sides of the bobbin, and wherein an overall number of the wires electrically connected to the bobbin is manageable by respectively managing a number of wires formed on each multi-conductive suspension.

17. The method of claim 13, further comprising depositing a metal on the substrate, a flexible printed circuit board, and pattern etching the metal to generate the plurality of wires.

18. The method of claim 17, wherein the metal is at least one of copper, steel use stainless, and titanium.

* * * * *